(12) United States Patent
Zeleznik et al.

(10) Patent No.: US 9,306,449 B2
(45) Date of Patent: Apr. 5, 2016

(54) ADJUSTABLE BIASING CIRCUITS FOR MEMS CAPACITIVE MICROPHONES

(71) Applicant: Robert Bosch GmbH, Stuttgart (DE)

(72) Inventors: Matthew A. Zeleznik, Pittsburgh, PA (US); John M. Muza, Venetia, PA (US)

(73) Assignee: Robert Bosch GmbH, Stuttgart (DE)

( * ) Notice: Subject to any disclaimer, the term of this patent is extended or adjusted under 35 U.S.C. 154(b) by 125 days.

(21) Appl. No.: 14/213,611

(22) Filed: Mar. 14, 2014

(65) Prior Publication Data

US 2014/0270262 A1 Sep. 18, 2014

Related U.S. Application Data

(60) Provisional application No. 61/789,137, filed on Mar. 15, 2013.

(51) Int. Cl.
 H04R 3/00 (2006.01)
 H02M 3/07 (2006.01)
 B81B 7/00 (2006.01)
 H04R 17/02 (2006.01)

(52) U.S. Cl.
 CPC ............... *H02M 3/07* (2013.01); *B81B 7/008* (2013.01); *B81B 2201/0257* (2013.01); *H04R 17/02* (2013.01); *H04R 2201/003* (2013.01)

(58) Field of Classification Search
 None
 See application file for complete search history.

(56) References Cited

U.S. PATENT DOCUMENTS

| 7,453,711 | B2* | 11/2008 | Yanagida | H02M 3/07 363/59 |
| 7,579,902 | B2* | 8/2009 | Frulio | G11C 5/145 327/536 |
| 7,872,884 | B2* | 1/2011 | Parramon | A61N 1/378 323/265 |
| 8,036,401 | B2 | 10/2011 | Poulsen et al. | |
| 8,041,056 | B2 | 10/2011 | Kinoshita | |
| 8,068,623 | B2 | 11/2011 | Lesso | |
| 8,076,968 | B1* | 12/2011 | Floyd | H02M 3/07 327/536 |
| 8,295,512 | B2 | 10/2012 | Deruginsky et al. | |
| 2009/0086992 | A1 | 4/2009 | Hsu et al. | |
| 2010/0166228 | A1 | 7/2010 | Steele et al. | |
| 2011/0018616 | A1 | 1/2011 | Li et al. | |
| 2011/0170714 | A1 | 7/2011 | Hanzlik et al. | |
| 2011/0311080 | A1 | 12/2011 | Jaar et al. | |
| 2013/0039500 | A1 | 2/2013 | Sridharan et al. | |
| 2013/0051583 | A1 | 2/2013 | Gueorguiev | |
| 2014/0191742 | A1* | 7/2014 | Kung | G05F 1/10 323/282 |
| 2014/0300409 | A1* | 10/2014 | Emira | H02M 3/07 327/536 |

FOREIGN PATENT DOCUMENTS

JP 2008153981 7/2008

* cited by examiner

*Primary Examiner* — Brenda Bernardi
(74) *Attorney, Agent, or Firm* — Michael Best & Friedrich LLP

(57) ABSTRACT

An adjustable charge pump system. The system includes a voltage regulator, a clock circuit, a voltage adjustment circuit, and a charge pump. The voltage regulator is configured to receive an input voltage and output a regulated voltage. The clock circuit is coupled to the voltage regulator and receives the regulated voltage. The voltage adjustment circuit is coupled to the voltage regulator and is configured to receive the regulated voltage and to output a driver voltage. The charge pump includes a plurality of stages. The output of the adjustable charge pump system is adjusted by disabling one or more stages of the first stage and the plurality of subsequent stages.

16 Claims, 6 Drawing Sheets

ADJUSTABLE BIASING CIRCUITS FOR MEMS CAPACITIVE MICROPHONES

RELATED APPLICATION

The present patent application claims the benefit of prior filed U.S. Provisional Patent Application No. 61/789,137, filed on Mar. 15, 2013, the entire content of which is hereby incorporated by reference.

BACKGROUND

The present invention relates to various architectures for creating a MEMS microphone biasing network with an adjustable output.

MEMS capacitive microphones operate utilizing conservation of charge. The amount of charge placed on the capacitor is set by a biasing circuit which pre-charges the capacitor. The amount of signal produced for a given capacitance and the change in capacitance in the presence of an acoustic signal is directly proportional to the amount of charge placed on the capacitor.

A high impedance switch network, usually consisting of two anti-parallel diodes with a MOS transistor in parallel with the diodes, is used to apply a fixed charge across two plates of a capacitor. When the microphone is initially turned on, the MOS transistor is switched on allowing a DC voltage to be put on one plate of the capacitor while the other plate is held at a different electrical potential. When the capacitor is fully charged the MOS transistor is switched off and the capacitor is left with a fixed charge across the two plates. When sound pressure waves hit the moveable plate of the capacitor, the capacitance changes. Since the charge is fixed, the voltage increases or decreases proportionally to the amount of capacitance change that is induced by the incident sound pressure.

Process variations in the sensor can affect the amount of electrical signal produced for a given sound pressure level between different microphones. Two of the most significant variations include the stiffness of the movable plate of the capacitor and the gap between the plates of the capacitor. With a fixed bias voltage these variations not only affect the sensitivity of the microphone but also the electrostatic forces on the sensor.

SUMMARY

By using a non-volatile memory element it is possible to trim both the sensitivity and consequently the electrostatic forces on the sensor by adjusting the bias voltage. In order to trim the microphone, the biasing circuit must be able to provide voltage steps with finer resolution than the sensitivity variation which is being compensated for. Embodiments of the invention describe various methods which can be used to generate the adjustable bias voltage based on different microphone design requirements.

Some of the key constraints which dictate the design of an adjustable bias system for MEMS capacitive microphones include the nominal bias voltage, the bias voltage adjustment range, the resolution of the bias voltage adjustments, the power supply voltage for the microphone, and the power consumption requirements for the microphone. The architectures described in this invention include solutions for high bias voltage systems where the voltage resolution requirements are low to solutions for low bias voltage systems where the voltage resolution requirements are high. The architectures described also take into account solutions which can provide the necessary voltage resolution while maintaining power supply voltage and power consumption compatibility.

In one embodiment, the invention provides an adjustable charge pump system. The system includes a voltage regulator, a clock circuit, a voltage adjustment circuit, and a charge pump. The voltage regulator is configured to receive an input voltage and output a regulated voltage. The clock circuit is coupled to the voltage regulator and receives the regulated voltage. The voltage adjustment circuit is coupled to the voltage regulator and is configured to receive the regulated voltage and to output a driver voltage. The charge pump includes a plurality of stages. A first stage is coupled to the voltage adjustment circuit and the clock circuit and comprises a plurality of switched latches. The first stage receives the driver voltage and the regulated voltage and outputs a first stage output voltage approximately equal to the sum of the driver voltage and the regulated voltage. A plurality of subsequent stages are coupled to a stage just prior and the clock circuit and comprise a plurality of switched latches. Each of the plurality of subsequent stages receives a stage input voltage and the regulated voltage and outputs a stage output voltage approximately equal to the sum of the stage input voltage and the regulated voltage. The output of the adjustable charge pump system is adjusted by disabling one or more stages of the first stage and the plurality of subsequent stages.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

Figure 1:
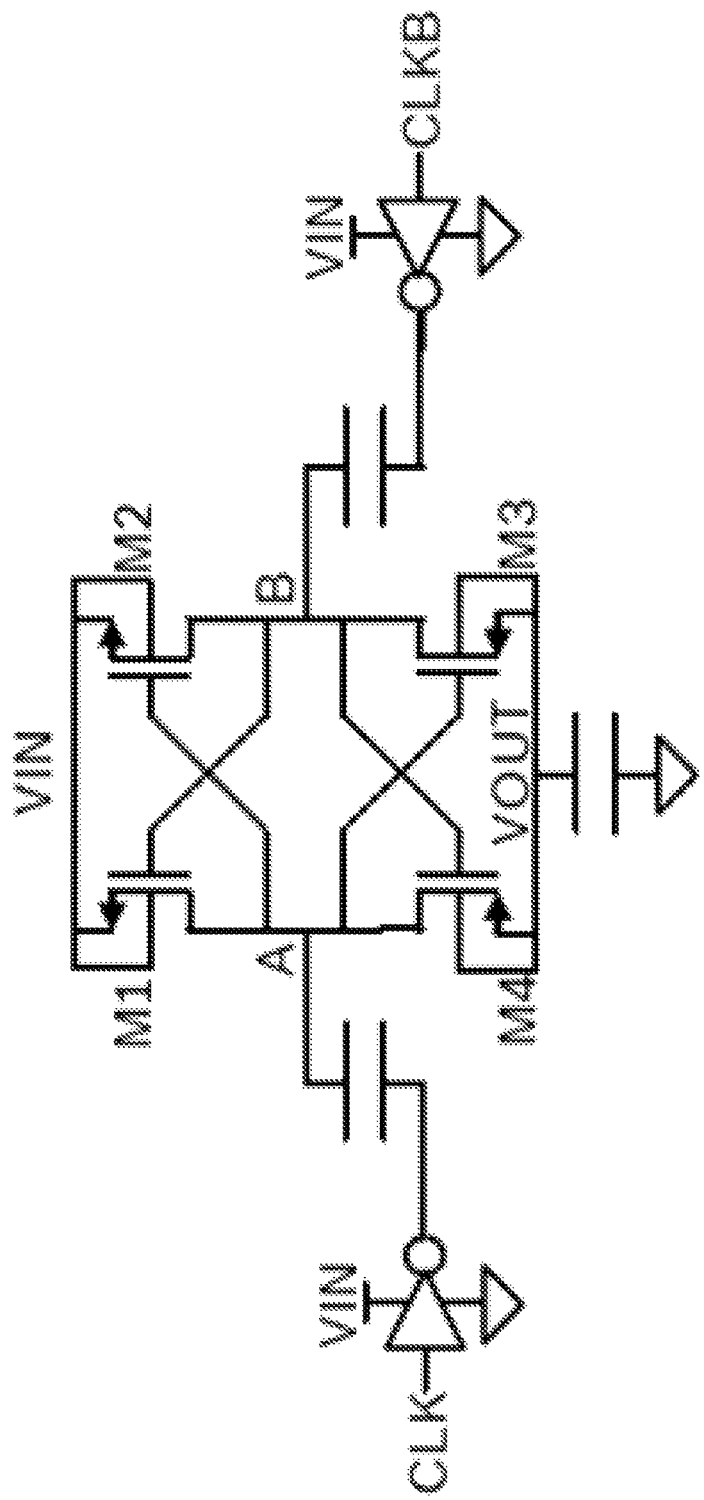
FIG. 1 is a schematic diagram of a voltage doubler.

FIG. 1 shows a standard implementation of a voltage doubler, or MOS charge pump stage. After a rising edge on a CLK signal, transistors M1 and M3 are switched off while transistors M2 and M4 are switched on. Transistor M2 allows the capacitor on Node B to be charged to an input voltage (VIN) while transistor M3 isolates an output voltage (VOUT) from Node B. Conversely, transistor M1 isolates the stored charge on Node A from VIN and since charge is conserved when CLK transitions from low to high, the voltage on Node A is doubled with reference to ground and is transferred to VOUT through M4. The same operation occurs on the rising edge of the CLKB signal with M2 and M4 switched off and M1 and M3 switched on.

The change in voltage, when the clock signal transitions, has to be large enough to flip the latches formed by M1/M2 and M3/M4. This sets a lower limit on the value for VIN. Use of low threshold voltage transistors to lower the requirement on VIN is possible, but, because of leakage currents in the off state, the structure will not operate efficiently. With proper selection of components, which minimizes leakage currents in either the transistors or the capacitors, large cascaded voltage doublers can be used to generate large voltages, limited only by the leakage currents of the various components at the high voltages.

Figure 2:
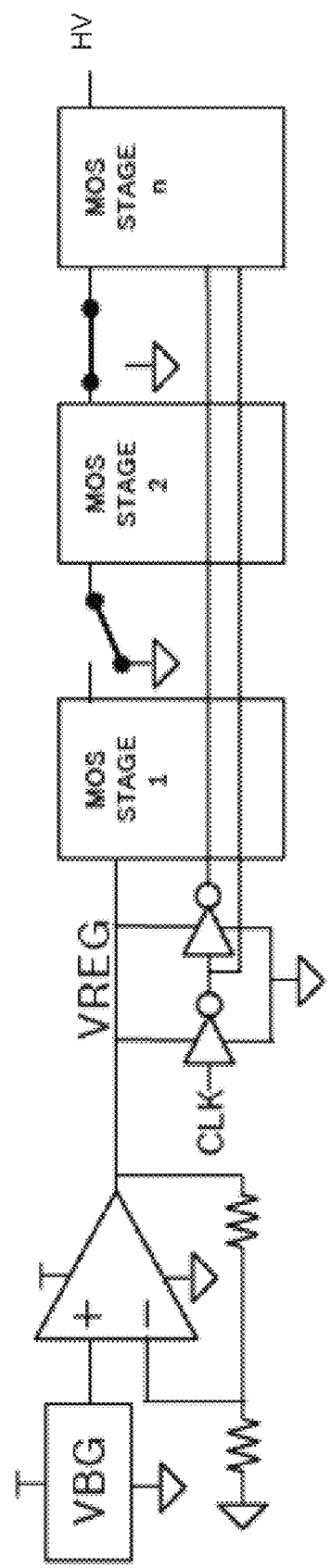
FIG. 2 is a schematic/block diagram of an adjustable charge pump system with stage switching.

FIG. 2 shows a system level architecture where adjustability in an output voltage, HV, is accomplished by switching in or out the number of cascaded voltage doublers (referred to as MOS stages). For high voltage charge pump systems the component selection for the switches must ensure that, when the switches are off, they do not have a significant leakage current associated with them. A supply and temperature independent reference voltage, VBG, is the input to a voltage regulator which provides a low output impedance driver for the voltage doublers and the clock signals. The regulated voltage must be high enough to flip the latches in the MOS stages but is also limited on the high side by the power supply voltage for the microphone. When all stages are connected the output voltage is given by (1).

$$HV = (VREG)(N_{TOTAL\_STAGES}) + VREG \quad (1)$$

When stages are switched off in order to lower the output, the output voltage is given by (2).

$$HV = (VREG)(N_{TOTAL\_STAGES} - N_{DISABLED\_STAGES}) + VREG \quad (2)$$

In this embodiment the output voltage is adjustable in incremental steps of VREG. That is, each stage has a stage input voltage (VREG for stage 1, zero or the output of the prior stage for each subsequent stage) and a clocked VREG input. The output of each stage is the sum of the input voltage and VREG. When the target voltage is large the step size increment of VREG may be small enough to provide sufficient resolution for the bias voltage steps. In the example shown in FIG. 2, MOS Stage 1 is disabled. Thus, HV=(VREG)($N_{TOTAL\_STAGES}$-1)+VREG or (VREG)($N_{TOTAL\_STAGES}$).

Figure 3:
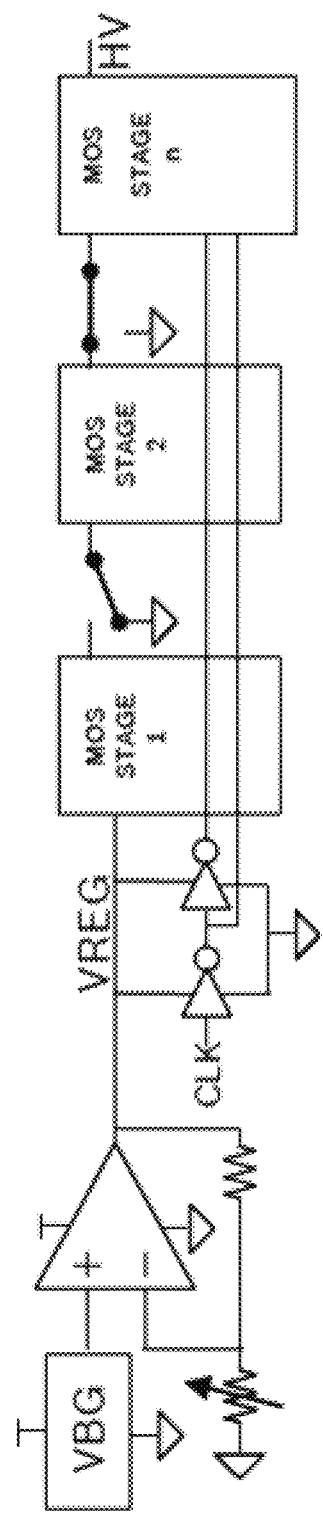
FIG. 3 is a schematic/block diagram of an adjustable charge pump system with stage switching and variable VREG gain.

One modification which can be made to the aforementioned system is to segment the resistors in the regulator amplifiers feedback so that the regulator voltage can also be adjusted in conjunction with the number of stages as shown in FIG. 3. The output voltage will be given by formulas (1) and (2) where VREG can be set to an input voltage (VIN) anywhere between the minimum voltage needed to flip the latches in the MOS stages and the maximum voltage where the regulator amplifier can operate due to headroom constraints. In this architecture if the maximum regulator voltage is twice the minimum regulator voltage then the resolution of the output voltage will only be limited by the number of regulator gain settings and MOS pump stages. If the maximum regulator voltage is less than twice the minimum regulator voltage then there will be discrete ranges of output voltages which cannot be produced with this architecture.

The input voltage (VIN) to the first stage of the voltage doublers can also be decoupled from the regulated voltage which powers the clock buffers. By separating the regulated clock voltage from the input voltage, it is possible to ensure that the clock voltage is always large enough to flip the latches in the MOS pump stages while having the input to the first stage lower than the minimum clock voltage. In this configuration the output voltage will be given by (3) where VIN is adjustable and the resolution will be limited by the number of attenuation settings available to create VIN.

$$HV = (VREG)(N_{STAGES\_OUT}) + VIN \quad (3)$$

Figure 4:
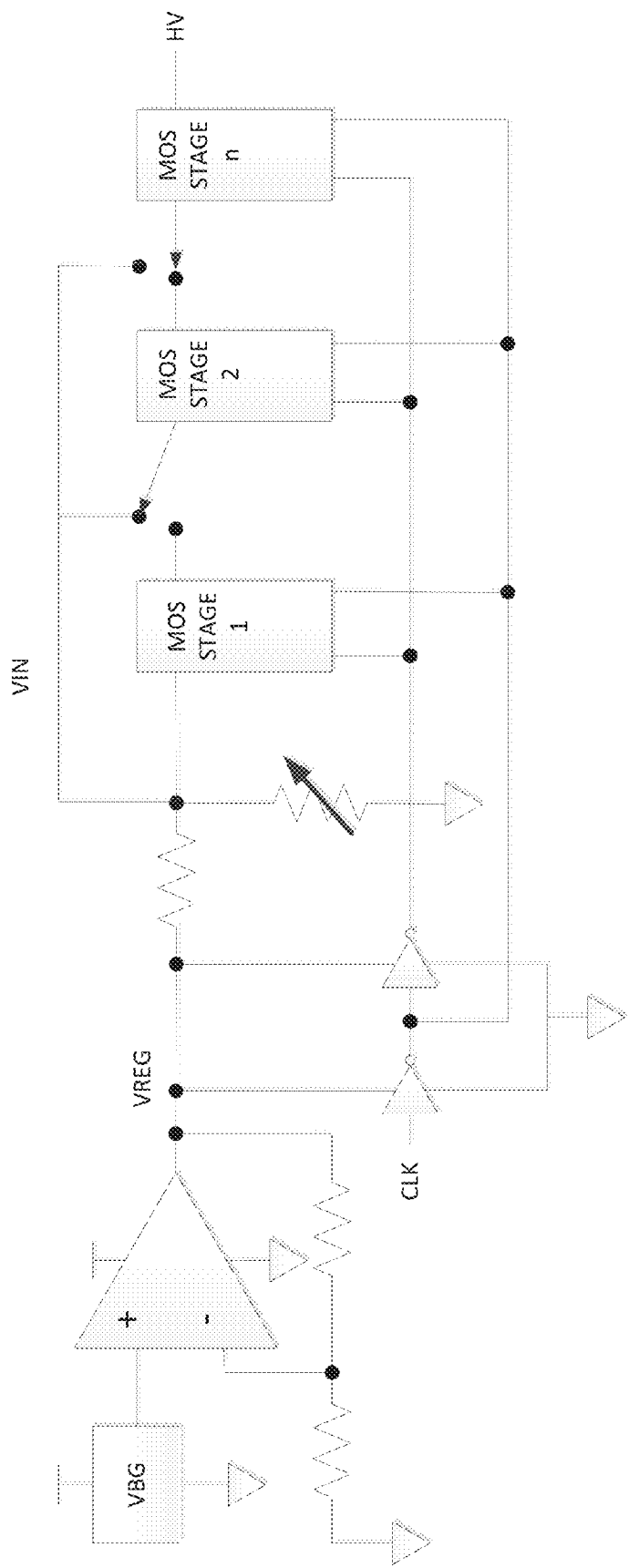
FIG. 4 is a schematic/block diagram of an adjustable charge pump system with separate input and clock voltages, with VREG fed to the input of the first non-disabled stage.
Figure 5:
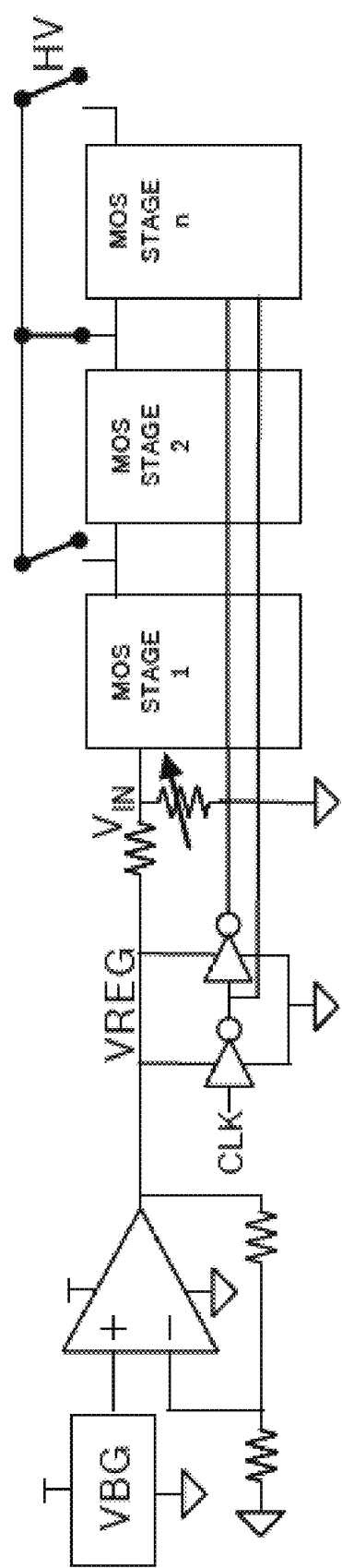
FIG. 5 is a schematic/block diagram of an adjustable charge pump system with separate input and clock voltages, with the output of the system taken from the desired stage.

In order for VREG to always be able to impact the output voltage, it is necessary to either feed VREG to the input of the first non-disabled stage (FIG. 4) or the output must be taken from the desired MOS stage (FIG. 5).

Figure 6:
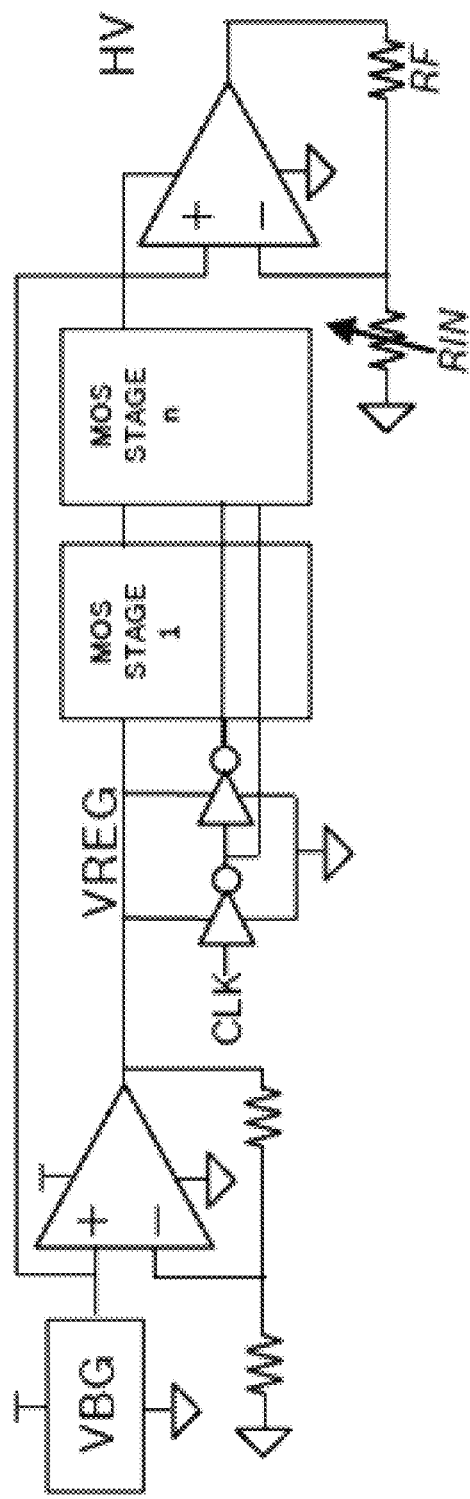
FIG. 6 is a schematic/block diagram of an adjustable high voltage amplifier with charge pump supply.

The above systems all share the requirement that the output of the biasing network only has to charge the sense capacitor and not supply a DC current. FIG. 6 shows an alternative biasing system in which the charge pump powers an amplifier whose supply voltage is created by the charge pump. In this system the reference voltage, VBG, is amplified and the resolution of the high voltage output is only limited by the number of gain settings for the high voltage amplifier. Because the charge pump has to supply the DC current and bias voltage for the amplifier, the power consumption of this system is inherently higher than the previous systems which do not need to supply a DC current. One significant advantage of this system is that the amplifier can be designed to have sufficient bandwidth to dynamically adjust the bias in accordance with the acoustic signal in order to limit the motion of the diaphragm.

What is claimed is:

1. An adjustable charge pump system, comprising:
   a voltage regulator configured to receive an input voltage and output a regulated voltage;
   a clock circuit coupled to the voltage regulator and receiving the regulated voltage;
   a voltage adjustment circuit coupled to the voltage regulator and configured to receive the regulated voltage and to output a driver voltage; and
   a charge pump, including
   a first stage coupled to the voltage adjustment circuit and the clock circuit and comprising a plurality of switched latches, the first stage receiving the driver voltage and the regulated voltage and outputting a first stage output voltage approximately equal to the sum of the driver voltage and the regulated voltage, and
   a plurality of subsequent stages coupled to a stage just prior and the clock circuit and comprising a plurality of switched latches, each of the plurality of subsequent stages receiving a stage input voltage and the regulated voltage and outputting a stage output voltage approximately equal to the sum of the stage input voltage and the regulated voltage;
   wherein an output of the adjustable charge pump system is adjusted by disabling one or more stages of the first stage and the plurality of subsequent stages.

2. The adjustable charge pump system of claim 1, wherein the one or more stages are disabled by modifying a stage input of one of the plurality of subsequent stages.

3. The adjustable charge pump system of claim 2, wherein the stage input is one of the stage output of the stage just prior and ground.

4. The adjustable charge pump system of claim 2, wherein the stage input is one of a stage output of the stage just prior and the driver voltage.

5. The adjustable charge pump system of claim 1, the output of the adjustable charge pump system is coupled to a stage output of one of the plurality of subsequent stages.

6. The adjustable charge pump system of claim 5, wherein a switch connects stage output to the output of the adjustable charge pump system.

7. The adjustable charge pump system of claim 1, wherein the first stage receives the regulated voltage from the clock circuit in a clocked manner.

8. The adjustable charge pump system of claim 1, wherein the plurality of subsequent stages receive the regulated voltage from the clock circuit in a clocked manner.

9. The adjustable charge pump system of claim 1, wherein the driver voltage is less than the regulated voltage.

10. The adjustable charge pump system of claim 1, wherein the driver voltage is less than a voltage required to switch the plurality of switched latches of the first stage and the plurality of switched latches of the plurality of subsequent stages.

11. The adjustable charge pump system of claim 1, wherein the output of the adjustable charge pump system biases a MEMS microphone.

12. The adjustable charge pump system of claim 1, wherein the voltage adjustment circuit includes a resistor coupled between the regulated voltage and the driver voltage and a resistor coupled between the driver voltage and common.

13. The adjustable charge pump system of claim 12, wherein the resistor coupled between the driver voltage and common is adjustable.

14. The adjustable charge pump system of claim 1, wherein the input voltage is supply and temperature independent.

15. The adjustable charge pump system of claim 1, wherein the voltage regulator is a low output impedance driver.

16. The adjustable charge pump system of claim 1, wherein a maximum regulated voltage is twice a minimum regulated voltage.

\* \* \* \* \*